United States Patent [19]

Kodama et al.

[11] Patent Number: 4,695,967
[45] Date of Patent: Sep. 22, 1987

[54] HIGH SPEED MEMORY ACCESS CIRCUIT OF CRT DISPLAY UNIT

[75] Inventors: Masahiro Kodama; Tatsuya Sakae, both of Kusatsu; Yoshio Urano, Ootsu, all of Japan

[73] Assignee: Daikin Industries, Ltd., Osaka, Japan

[21] Appl. No.: 708,583

[22] Filed: Mar. 5, 1985

[30] Foreign Application Priority Data

Mar. 9, 1984 [JP] Japan .................. 59-46232
Mar. 15, 1984 [JP] Japan .................. 59-50390

[51] Int. Cl.[4] .................. G06F 15/62; G09G 1/14
[52] U.S. Cl. .................. 364/521; 340/703; 340/749; 340/750; 340/801; 364/518; 364/900
[58] Field of Search ........ 364/518, 521, 200 MS File, 364/900 MS File; 340/721, 745, 747, 750, 801, 802, 703, 749

[56] References Cited

U.S. PATENT DOCUMENTS

| | | | |
|---|---|---|---|
| 4,070,710 | 1/1978 | Sukonick et al. | 340/711 |
| 4,112,422 | 9/1978 | Mayer et al. | 340/723 |
| 4,197,590 | 4/1980 | Sukonick et al. | 340/731 |
| 4,234,931 | 11/1980 | Karaiwa et al. | 340/799 |
| 4,240,075 | 12/1980 | Bringol | 340/750 |
| 4,249,172 | 2/1981 | Watkins et al. | 340/750 |
| 4,424,513 | 1/1984 | Hatao et al. | 340/802 |
| 4,439,762 | 3/1984 | Van Vliet et al. | 340/728 |
| 4,484,187 | 11/1984 | Brown et al. | 340/721 |
| 4,490,797 | 12/1984 | Staggs et al. | 340/721 |
| 4,491,832 | 1/1985 | Tanaka | 340/721 |
| 4,527,154 | 7/1985 | Tanaka | 340/721 |

Primary Examiner—Errol A. Krass
Assistant Examiner—Daniel W. Juffernbruch
Attorney, Agent, or Firm—Staas & Halsey

[57] ABSTRACT

A high speed memory access circuit of a CRT display unit generates address signals from a memory cycle controller (20) based on an external write signal provided from the exterior and supplies the address signals to a frame memory (8) structured by dynamic random access memories (81 to 86). The frame memory (8) reads out, based on the address signals, first and second data in parallel, each data being divided into odd number region data and even number regon data. The odd number region data and even number region data of the first data are provided in series through shift registers (313, 323), respectively and the odd number region data and even number region data of the second data are provided in series through shift registers (314, 324), respectively. Thus, the first and second data read out from the frame memory (8) are provided in series respectively in a form divided into odd number data and even number data and accordingly, it is made possible to employ shift registers of relatively low speed even in the case of a high resolution pattern displayed by using a non-interlace CRT display unit of 60 Hz.

3 Claims, 14 Drawing Figures

HIGH SPEED MEMORY ACCESS CIRCUIT OF CRT DISPLAY UNIT

BACKGROUND OF THE INVENTION

1. Field of the Invention

The present invention relates to a high speed memory access circuit of a CRT display unit. More particularly, the present invention relates to a high speed memory access circuit to be utilized in a raster scan type color graphic display unit, by which high speed access is applied to a frame memory where pattern data is stored.

2. Description of the Prior Art

Figure 1:
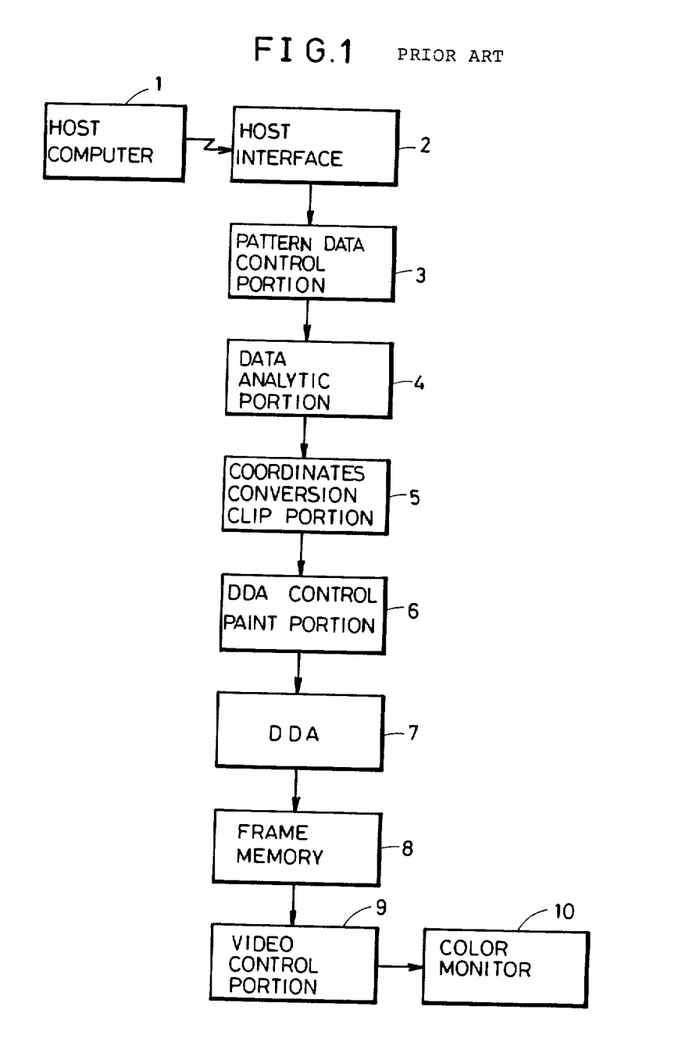
FIG. 1 is a schematic block diagram of a conventional color graphic display unit.

FIG. 1 is a schematic block diagram of a conventional color graphic display unit which provides a background to the present invention. First, referring to FIG. 1, the operation of a conventional raster scan type graphic display unit will be briefly described. Data is supplied from a host computer 1 to a pattern data control portion 3 through a transmission line and a host interface 2. The pattern data control portion 3 receives the data from the host computer 1 and arranges the data as a pattern to be displayed so that the data arranged as a pattern is stored in a segment buffer, not shown. A data analytic portion 4 takes out the content of the segment buffer and analyzes the data whereby vectors are calculated based on start point coordinates and end point coordinates. Then, in case of applying extension, reduction, rotation, parallel movement and the like to a pattern, a coordinate conversion clip portion 5 multiplies the data by necessary matrices. In a case where a portion of a pattern on the screen of a CRT display unit is bounded by border lines, the portions protruding from the border lines are clipped off by the coordinate conversion clip portion 5.

In the case of painting out a pattern, a DDA control paint portion 6 provides decomposed line segments existing inside the coordinates of the vertexes of the respective vectors whereby data for painting out is obtained. A DDA 7 is a straight line generating circuit, which calculates coordinates of intermediate points of a vector connecting a start point and an end point based on the data from the DDA control paint portion 6 and develops the result of calculation in the frame memory 8 to obtain a straight line. The frame memory 8 stores the dots on the straight line generated by the DDA 7. The data stored in the frame memory 8 is supplied to a video control portion 9 so that the data is converted into an analog signal by D/A conversion and is also converted into a video signal based on a color conversion table so as to be supplied to a color monitor 10. As a result, in the color monitor 10, a pattern based on the data provided from the host computer is displayed.

Figure 2:
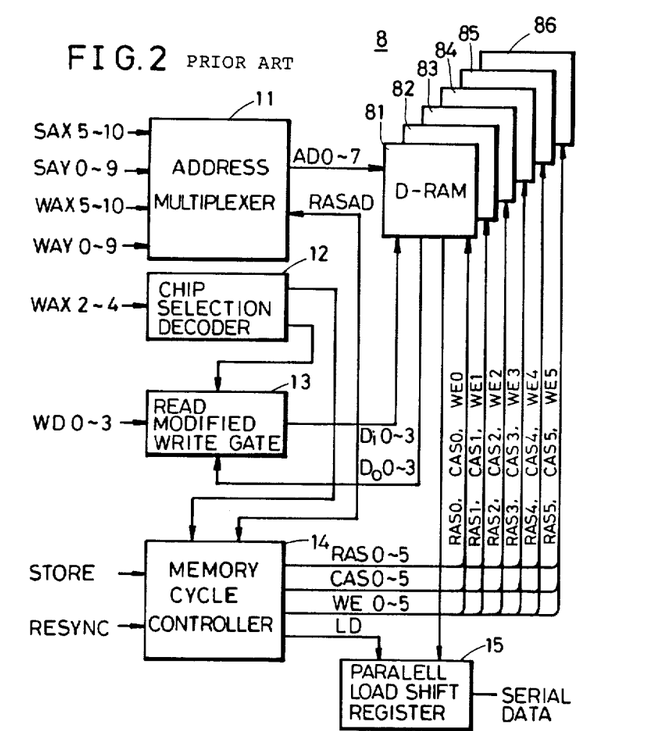
FIG. 2 is a schematic block diagram of a frame memory which provides a background to the present invention and to which an embodiment of the present invention is applied.
Figure 3:
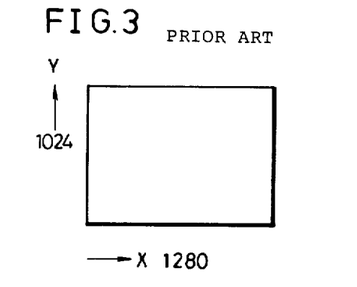
FIG. 3 is a diagram for explaining the composition of a screen of a color monitor.
Figure 4:
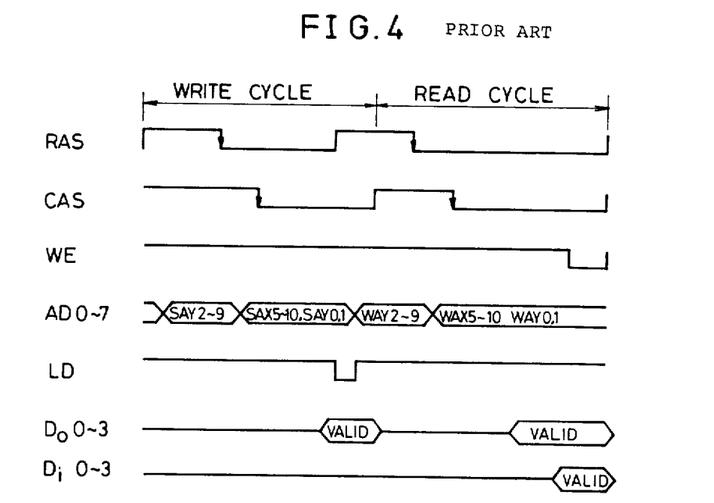
FIG. 4 is a timing chart for explaining the operation of the circuit shown in FIG. 2.

FIG. 2 is a block diagram showing the frame memory 8 shown in FIG. 1 and peripheral circuits thereof; FIG. 3 is a diagram showing a composition of a screen in a color monitor; and FIG. 4 is a timing chart for explaining the operation of the frame memory shown in FIG. 2.

Now, referring to FIGS. 2 to 4, a more detailed description will be made of the operation of the frame memory 8 shown in FIG. 1. The color monitor 10 is composed of 1280 bits as the X coordinates and 1024 bits as the Y coordinates as shown in FIG. 3. For this purpose, dynamic random access memories (hereinafter referred to as D-RAM's) 81 to 86 of 64K bytes are employed as shown in FIG. 2. As address signals, X read address signals SAX 5 to 10, Y read address signals SAY 0 to 9, X write address signals WAX 5 to 10 and Y write address signals WAY 0 to 9 are applied to an address multiplexer 11. The address multiplexer 11 applies, based on a RASAD signal provided from a memory cycle controller 14, address signals AD 0 to 7 to the D-RAM's 81 to 86 at the time of reading and writing of the data.

WAX 2 to 4 form the lower three bits of the write address signals and are supplied to a chip selection decoder 12. The chip selection decoder 12 supplies, based on the singals applied thereto, chip selection signals CS 0 to 5 for selection of any one of the six D-RAM's 81 to 86 to the memory cycle controller 14. The write data WD 0 to 3 of 4 bits are supplied to a read modified write gate 13. The read modified write gate 13 performs a read modified write operation and determines write data Di 0 to 3. More specifically, when the write data WD0 to 3 are applied to the read modified write gate 13, the read modified write gate 13 supplies the write data Di 0 to 3 to the D-RAM's 81 to 86, assuming a proper relation with the output data Do 0 to 3.

The memory cycle controller 14 determines a memory read cycle in synchronism with a horizontal synchronizing signal RESYNC and determines a write cycle by a write signal STORE provided from the exterior. Subsequently, address control signals RAS 0 to 5 and CA 0 to 5 and write enable signals WE 0 to 5 are supplied to the D-RAM's 81 to 86 respectively, and a load signal LD is supplied to a parallel load shift register 15.

Now, referring to FIG. 4, the operation of the frame memory 8 shown in FIG. 2 will be described. At the time of writing, the Y direction is addressed with 8 bits of the Y write address signals WAY 2 to 9 according to the timing of descent of the address control signal RAS, and the X direction is addressed with 8 bits of the X write address signals WAX 5 to 10 and the Y write address signals WAY 0 and 1 according to the timing of descent of the address control signal CAS. Then, the 4-bit write data WD 0 to 3 are processed by read modified write to have a proper relation with the read out data Do 0 to 3 and the 4-bit data Di 0 to 3 are written in the D-RAM's 81 to 86.

At the time of reading, the Y direction is addressed based on the 8-bit Y read address signals SAY 2 to 9 according to the timing of descent of the address control signal RAS, and the X direction is addressed based on the 8 bits of the X read address signals SAX 5 to 10 and the Y read address signals SAY 0 and 1 according to the timing of descent of the address control signal CAS. As a result, data of 24 bits in all, namely, 4 bits from each of the D-RAM's 81 to 86, are read out at a time and supplied to the parallel load shift register 15. The parallel load shift register 15 loads in parallel the 24 bits of data from the D-RAM's 81 to 86 in response to the load signal LD from the memory cycle controller 14. Then, the data are shifted by the clock pulses of a predetermined video scanning frequency to be provided as serial data.

In a such a color graphic display unit as structured above, the video scanning frequency is defined by the memory cycle of the D-RAM's 81 to 86. The access speed of a D-RAM currently in use is limited to the video scanning frequency band 55 MHz and such D-RAM's cannot meet the conditions of a CRT display unit of a 60 Hz non-interlace system requiring 100 MHz or more. In addition, as for the parallel load shift register 15 for shifting a read signal, an inexpensive integrated circuit operable with a frequency band of 100 MHz does not exist at present and some measures will need to be taken in this point. Moreover, for high speed writing into the frame memory 8, it is necessary to increase the number of bits for simultaneous writing since there is a limitation on the memory cycle of the D-RAM's 81 to 86. For this purpose, it is necessary to consider an efficient structure of writing areas.

SUMMARY OF THE INVENTION

Therefore, a primary object of the present invention is to provide a high speed memory access circuit of a CRT display unit, in which a high speed memory cycle can be obtained to make display of a good picture in a CRT display unit of high resolution.

Briefly stated, the present invention is structured in the following manner. A frame memory is structured by dynamic random access memories capable of reading and writing data in the Nibble mode. Address signals are generated based on an external write signal provided from the exterior and based on the address signals, the first and the second data from the frame memory are read out in parallel in a form which is divided into odd number region data and even number region data. A plurality of bits of data corresponding to the odd number region of the first data are provided in series by the first parallel/series conversion means. Subsequently, a plurality of bits of data corresponding to the odd number region of the second data are provided in series by the third parallel/series conversion means and a plurality of bits of data corresponding to the even number region of the first data are provided in series by the second parallel/series conversion means. Subsequently, a plurality of bits of data corresponding to the even number region of the second data are provided in series by the fourth parallel/series conversion means.

Consequently, in accordance with the present invention, the number of bits of data read out from the frame memory can be increased without using a write cycle period in the Nibble mode as a read cycle period. As a result, a pattern of a high resolution can be represented by using a non-interlace CRT display unit of 60 Hz. In addition, since the first and second data read out from the frame memory are divided into the odd number data and the even number data to be provided in series, it is made possible to employ shift registers of relatively low speed and the frame memory and the peripheral circuits can be structured by inexpensive devices such as dynamic random access memories or TTL for example, and accordingly the whole system can be manufactured at low cost.

These objects and other objects, features, aspects and advantages of the present invention will become more apparent from the following detailed description of the present invention when taken in conjunction with the accompanying drawings.

DESCRIPTION OF THE EMBODIMENT

In the following, the present invention will be described in detail in connection with an embodiment shown in the drawings.

Figure 5:
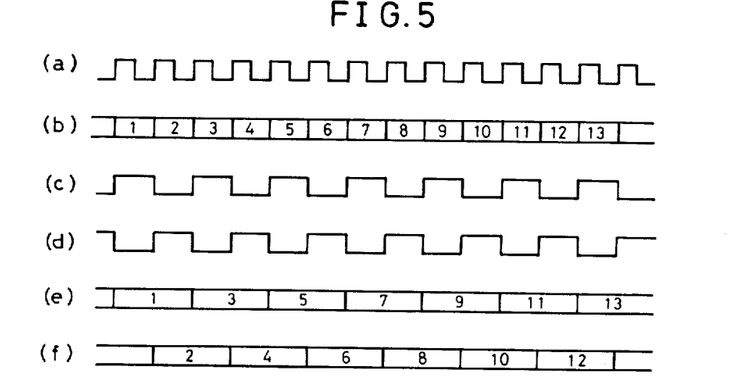
FIG. 5 is a timing chart at the time of reading out odd number data and even number data from a frame memory utilized in an embodiment of the present invention.

FIG. 5 is a timing chart for explaining the read timing of D-RAMs to be utilized in an embodiment of the present invention. From the D-RAM'S 81 to 86 as described above in connection with FIG. 2, data shown in FIG. 5(b) are read out in response to a second clock pulse (shown in FIG. 5(c)) having a period twice as large as that of the first clock pulse shown in FIG. 5(a), as well as in response to a third clock pulse (shown in FIG. 5(d)) having a phase deviated from the second clock pulse by one cycle of the first clock pulse. More specifically, the odd number data 1, 3, 5 . . . stored in the D-RAM's 81 to 86 are read out in response to the second clock pulse (as shown in FIG. 5(e)), while the even number data 2, 4, 6 . . . are read out in response to the third clock pulse (as shown in FIG. 5(f)). In the following description of this embodiment, the mode for reading the odd number data by the second clock pulse is referred to as the odd mode and the mode for reading the even number data by the third clock pulse is referred to as the even mode.

Figure 6:
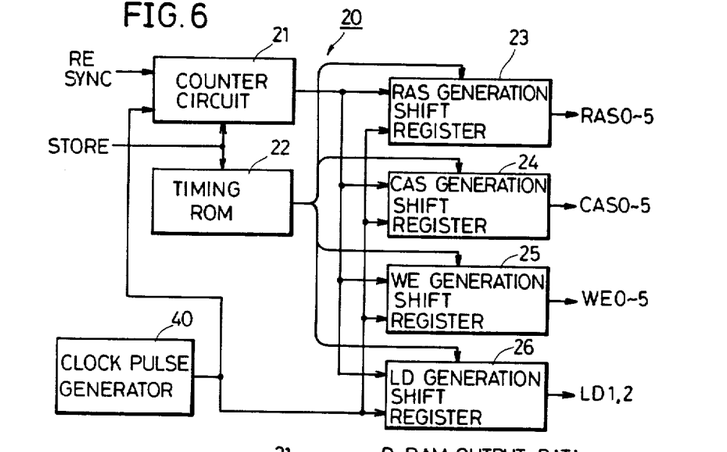
FIG. 6 is a block diagram of a memory cycle controller included in an embodiment of the present invention.

FIG. 6 is a block diagram showing a memory cycle controller 20 included in an embodiment of the present invention. The memory cycle controller 20 shown in FIG. 6 corresponds to the memory cycle controller 14 shown in FIG. 2. First, referring to FIG. 6, the structure of the memory cycle controller 20 will be described. A counter circuit 21 includes two duodecimal counters so that selection is made between a duodecimal counter and a quadrivicenary counter.

To the counter circuit 21, a write signal STORE, a horizontal synchronizing signal RESYNC and a clock pulse are applied from the exterior. When the write signal STORE from the exterior is applied to the counter circuit 21, the duodecimal counter for a write cycle is selected. If the write signal STORE is not applied thereto, the quadrivicenary counter for a read cycle is selected. Upon receipt of the write signal STORE by the counter circuit 21, the counter circuit 21 provides a reset pulse each time 12 clock pulses are counted. In other words, the counter circuit 21 provides two reset pulses in the write cycle. In contrast if the write signal STORE is not applied, the counter circuit 21 serves as the quadrivicenary counter, which provides a reset pulse when 24 clock pulses are counted. The reset pulse provided from the counter circuit 21 is applied as a load pulse to a RAS generation shift register 23, a CAS generation shift register 24, a WE generation shift register 25 and a LD generation shift register 26.

The external write singal STORE is applied also to a timing ROM 22. The timing ROM 22 stores in advance write timing data and read timing data so as to provide the write timing data upon receipt of the external write signal STORE and to provide the read timing data in the absence of the external write signal. The write timing data or read timing data provided from the timing ROM 22 is applied to the above-mentioned shift registers, namely, the RAS generation shift register 23, the CAS generation shift register 24, the WE generation shift register 25 and the LD generation shift register 26.

To these shift registers 23 to 26, clock pulses are applied. Based on the reset pulse from the counter circuit 21, the RAS generation shift register 23 loads the write timing data or read timing data read out from the timing ROM 22 and shifts the data successively according to the clock pulses so that address control signals RAS 0 to 5 are provided. In the same manner, the CAS generation shift register 24 provides address control signals CAS 0 to 5; the WE generation shift register 25 provides write enable signals WE 0 to 5; and the LD generation shift register 26 provides load pulses LD 1 and 2.

The address control signals RAS 0 to 5, CAS 0 to 5 and write enable signals WE 0 to 5 provided from these shift registers 23 to 25 are supplied to the previously described D-RAM's 81 to 86 as shown in FIG. 2. The load pulses LD 1 and 2 provided from the LD generation shift register 26 are supplied to a parallel load shift register circuit 30 to be described below with reference to FIG. 7.

Figure 7:
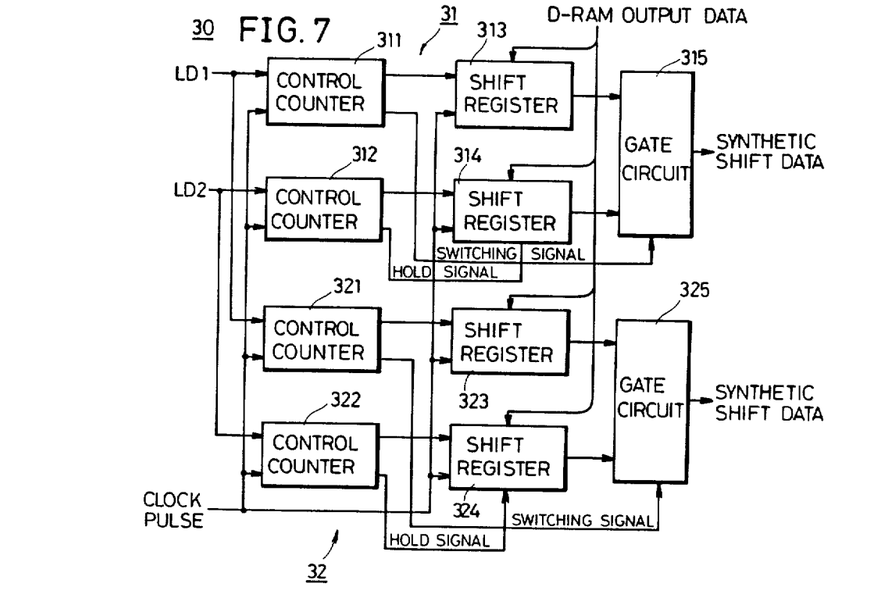
FIG. 7 is a block diagram of a parallel load shift register circuit included in an embodiment of the present invention.

FIG. 7 is a block diagram of a parallel load shift register circuit 30 included in an embodiment of the present invention. This parallel load shift register circuit 30 corresponds to the parallel load shift register circuit 15 shown in FIG. 2. First, referring to FIG. 7, the structure of the parallel load shift register circuit 30 will be described. As described previously in conjunction with FIG. 5, the parallel load shift register circuit 30 comprises a circuit 31 for providing the data obtained by shifting the odd number data read out from the D-RAM's 81 to 86 in the odd mode as well as a circuit 32 for providing the data obtained by shifting the even number data read out therefrom in the even mode.

The odd number data shifting circuit 31 comprises control counters 311 and 312, shift registers 311 and 314 and a gate circuit 315. To the control counter 311, the load pulse LD1 and the clock pulse are applied. The control counter 311 provides a timing pulse for loading in the shift register 313, the first 12 bits of data out of the 24 bits of odd number data read out from the D-RAM,'s 81 to 86 in synchronism with the load pulse LD 1 and also provides a selection signal for turning the gate circuit 315 to either side. The timing pulse provided from the control counter 311 is supplied to the shift register 313, while the selection signal provided therefrom is supplied to the gate circuit 315. To the shift register 313, clock pulses are applied. Accordingly, based on the timing pulse from the control counter 311, the shift register 313 loads the first 12 bits of data out of the odd number data read out from the D-RAM's 81 to 86 and provides the data shifted successively according to the clock pulses. The shifted data provided from the shift register 313 are supplied to the gate circuit 315.

To the control counter 312, the load pulse LD 2 and the clock pulse are applied. The control counter 312 counts clock pulses in synchronism with the load pulse LD 2 and provides a timing pulse and a hold signal. The timing pulse serves to load in the shift register 314, the 12 bits of the latter half of the 24 bits of odd number data read out from the D-RAM's 81 to 86. The hold signal serves to hold the shift register 314 during a period in which the 12 bits of the first half of the odd number data are being shifted by the shift register 313. The timing pulse and the hold signal provided from the control counter 312 are supplied to the shift register 314. To the shift register 314, clock pulses are applied. Accordingly, based on the timing pulse from the control counter 312, the shift register 314 loads the 12 bits of the latter half of the odd number data and maintains the hold state during the application of the hold signal. After completion of the shifting of the 12 bits of the first half of the odd number data, the shift register 314 shifts the 12 bits of the latter half of the odd number data based on the clock pulses and provides the shifted data.

The shifted data provided from the shift register 314 are supplied to the gate circuit 315. The gate circuit 315 is turned to the side of the shift register 313 or to the side of the shift register 314 so that the output of shift register 313 or 314 is provided as synthesized shifted data.

The even number data shifting circuit 32 comprises, in the same manner as in the above described odd number data shifting circuit 31, control counters 321 and 322, shift registers 323 and 324 and a gate circuit 325. The control counter 321 provides a timing pulse for loading in the shift register 323, the 12 bits of the first half of the even number data and also provides a selection signal for turning the gate circuit 325 to either side.

The control counter 322 provides a timing pulse for loading the 12 bits of the latter half of the even number data in the shift register 324 and also provides a hold signal for maintaining the shift register 324 in the hold state during a period in which the 12 bits of the first half of the even number date are being shifted by the shift register 323. The shift register 323 shifts the 12 bits of the first half of the even number data and after completion of the shifting of the first 12 bits of the even number data, the shift register 324 shifts the 12 bits of the latter half of the even number data. The gate circuit 325 selects the output of the shift register 323 and the output of the shift register 324 to provide synthesized shifted data.

Figure 8:
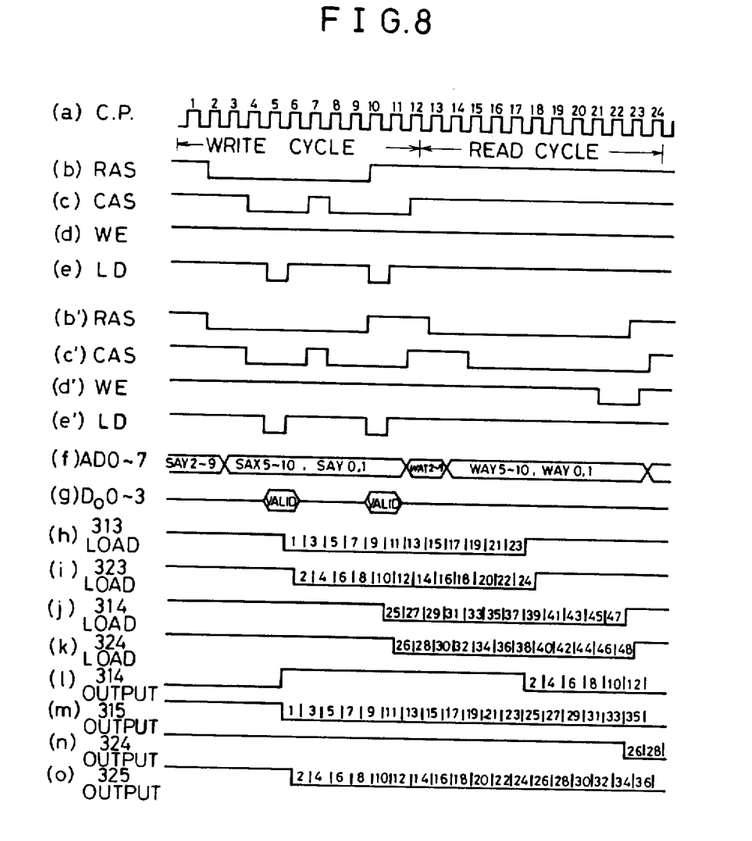
FIG. 8 is a timing chart for explaining the operation of the circuits shown in FIGS. 6 and 7.

FIG. 8 is a timing chart for explaining the operation of the circuits shown in FIGS. 2, 6 and 7. Now, referring to FIGS. 2 and 5 to 7, the specific operation of an embodiment of the present invention will be described. If the external write signal STORE is not applied, the counter circuit 21 operates as a quadrivicenary counter to provide a reset signal each time 24 clock pulses as shown in FIG. 8(a), are counted. Based on the reset signal from the counter circuit 21, the RAS generation shift register 23, the CAS generation shift register 24, the WE generation shift register 25 and the LD generation shift register 26 load the read timing data read out from the timing ROM 22 and shift the data successively in response to the clock pulses to provide output. More specifically, the RAS generation shift register 23 provides the address control signal RAS shown in FIG. 8(b) and the CAS generation shift register 24 provides the address control signal CAS shown in FIG. 8(c). The address control signal CAS is applied with the timing in which it descends twice in one read cycle period. With this timing, 24 bits of data are read out, at the time of the first descent, as the data of the first half corresponding to "0, 0" of the X read addresses SAX 5 and 6, and then at the time of the next descent, 24 bits of data are read out as the data of the latter half corresponding to "1, 0" of the X read addresses SAX 5 and 6.

The WE generation shift register 25 is maintained at a high level in the read cycle as shown in FIG. 8(d) since it serves to provide the write enable signal WE. The LD generation shift register 26 provides the load pulse LD shown in FIG. 8(e). In one read cycle period, two load pulses LD are provided, since it is necessary to load it the parallel load shift register circuit 30, the 24 bits of data corresponding to "0, 0" of the X read addresses SAX 5 and 6 and the 24 bits of data corresponding to "1, 0" of the X read addresses SAX 5 and 6.

On the other hand, if the write signal STORE is applied, the counter circuit 21 operates as the duodecimal counter to provide a reset pulse each time 12 clock pulses are counted. The shift registers 23 to 26 provide the address control signals RAS and CAS, the write enable signal WE and the load pulse LD each having a read cycle and a write cycle as shown in FIGS. 8(b') to 8(e').

The D-RAM's 81 to 86 shown in FIG. 2 read out the first half and the latter half of the data in one read cycle period as shown in FIG. 8(g) when the address control signals RAS and CAS are supplied thereto from the previously described memory cycle controller 20 and the address signals AD 0 to 7 are supplied thereto from the address multiplexer 11 shown in FIG. 2. More specifically, the respective D-RAM's 81 to 86 read out 4 bits of output data Do 0 to 3, namely 24 bits of data in all, twice. At this time, as described previously in conjunction with FIG. 5, the respective 24 bits of data are divided into groups of 12 bits of odd number data and 12 bits of even number data to be provided as an output. The 12 bits of the first half of the odd number data are supplied to the shift register 313 of the parallel load shift register circuit 30 and the 12 bits of the first half of the even number data are supplied to the shift register 323. On the other hand, the 12 bits of the latter half of the odd number data are supplied to the shift register 314 and the 12 bits of the latter half of the even number data are supplied to the load shift register 324.

In the parallel load shift register circuit 30, the control counter 311 counts clock pulses in synchronism with the load pulse LD 1 shown in FIG. 8(e) to provide a timing signal for loading the 12 bits of the first half of the odd number data in the shift register 313 as well as to provide a selection signal for turning the gate circuit 315 to the side of the shift register 313. Accordingly, as shown in FIG. 8(h), the shift register 313 loads the first 12 bits of the odd number data in response to the timing signal from the control counter 311 and shfts successively the thus loaded 12 bits of the first half of the odd number data to provide output through the gate circuit 315.

In the same manner, the control counter 321 provides a timing signal for loading the 12 bits of the first half of the even number data in the shift register 323 and also provides a selection signal for turning the gate circuit 325 to the side of the shift register 323. Accordingly, the shift register 323 loads the first 12 bits of the even number data as shown in FIG. 8(i) and shifts successively the loaded data in response to the clock pulses to provide output through the gate circuit 325.

On the other hand, the control counter 312 counts clock pulses in synchronism with the subsequent load pulse LD2 and provides a timing pulse for loading the 12 bits of the latter half of the odd number data in the shift register 314 as well as a hold signal for maintaining the shift register 314 in the hold state during the shifting operation of the shift register 313 as shown in FIG. 8(l). Accordingly, the shift register 314 loads the 12 bits of the latter half of the odd number data as shown in FIG. 8(j) and then, the shift register 314 shifts successively the data after the shifting operation of the shift register 313 so that output is provided through the gate circuit 315.

The gate circuit 315 is, after completion of the shifting operation of the shift register 313, turned to the side of the shift register 314 in response to the selection signal from the control counter 311. In the same manner, the control counter 322 counts clock pulses according to the subsequent load pulse LD2 and provides a timing signal for loading the 12 bits of the latter half of the even number data in the shift register 324 and also provides a hold signal. Accordingly, the shift register 324 loads the 12 bits of the latter half of the even number data and when the hold signal does not exist, namely, when the shifting operation of the shift register 323 is completed, the shift register 324 shifts successively the data in response to the clock pulses in the manner shown in FIG. 8(n), and the data thus shifted are provided through gate circuit 325.

At this time the gate circuit 325 is turned to the side of the shift register 324 upon completion of the shifting operation of the shift register 323. Accordingly, as shown in FIG. 8(m), the gate circuit 315 provides successively the 12 bits of the first half of the odd number data loaded in the shift register 313 and the 12 bits of the latter half of the odd number data loaded in the shift register 314. On the other hand, the gate circuit 325 provides successively as shown in FIG. 8(o), the 12 bits of the first half of the even number data loaded in the shift register 323 and the 12 bits of the latter half of the even number data loaded in the shift register 324.

Thus, the synthesized shifted data of 24 bits provided from the gate circuits 315 and 325 respectively are supplied to the video control portion 9 in synchronism with the clock pulse shown in FIG. 8(a) so as to be converted into a video signal.

Although in the foregoing description, the X coordinates are 1280 bits and the Y coordinates are 1024 bits using the D-RAM's 81 to 86, the number of coordinates is not limited thereto and may be further increased. In such a case, it is also necessary to increase the scanning frequency. However, such increase of the scanning frequency can be made in a manner in which data are read out four times in the Nibble mode with parallel shift registers being arrayed in four lines.

In the above description, 24 bits of data are read out at a time by the six D-RAM's 81 to 86. However, the present invention is not limited to such a structure. D-RAM's may be structured in a different manner to read 16 bits, 20 bits and 32 bits for example.

Figure 9A:
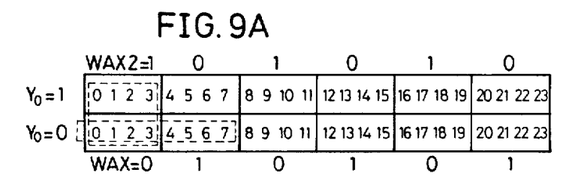
FIGS. 9A and 9B are diagrams showing data stored in case of an address signal of a frame memory being $Y_0=0$ or $Y_0=1$.
Figure 9B:
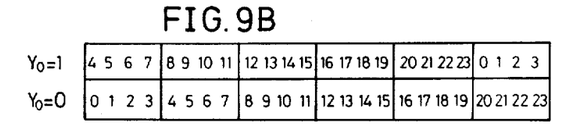
Figure 10:
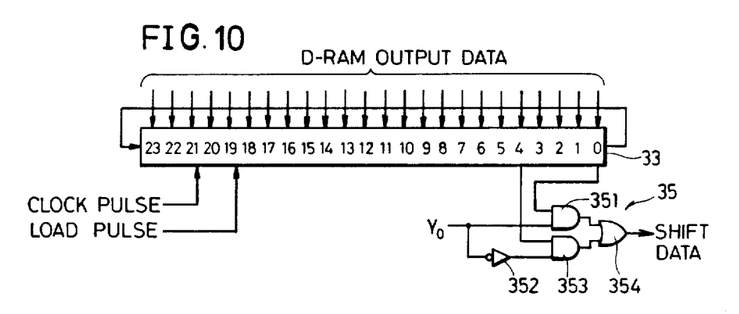
FIG. 10 is a block diagram showing a shift register circuit for reading the data shown in FIG. 9B.

FIGS. 9A and 9B are diagrams showing the data written in the Y address $Y_0=0$ or $Y_0=1$ in the D-RAM's. FIG. 10 is a diagram showing shift registers for reading out from the D-RAM,'s the data written as shown in FIG. 9B.

As shown in FIG. 9A, in case of writing 24 bits of data in the Y address $Y_0 = 0$ or $Y_0 = 1$ for example in the D-RAMs, conventionally data were generally divided into groups of 4 bits to be written. However, such a method for writing the data by every 4 bits in one write cycle period has a disadvantage that the writing time is made long and accordingly, a method may be considered in which data are divided for every 8 bits in the address direction. By contrast, in a data writing method in accordance with an embodiment of the present invention, as shown in FIG. 9B, 24 bits of data are divided into two groups: the first group (I) including the bit numbers 0 1 2 3, 8 9 10 11, 16 17 18 19 and the group (II) including the bit numbers 4 5 6 7, 12 13 14 15, 20 21 22 23, whereby 4 bits in the X direction and 2 bits in the Y direction, namely 8 bits in all are written in one write cycle period. This is because it is easier to process the data in the form of 4 bits in the X direction and 2 bits in the Y direction for example, since in such a graphic display unit as applied in the present invention, vector analysis is applied between start point coordinates and end point coordinates and these coordinates are linearly interpolated by the DDA 7 so as to be represented on the color monitor 10 as described previously in conjunction with FIG. 1.

As shown in FIG. 9B, in order to write 8 bits in all including 4 bits in the X direction and 2 bits in the Y direction, control is performed according to the following equations:

$$Y_0(I) = X2 \cdot \alpha + \bar{\alpha} \cdot Y_0$$

$$Y_0(II) = \overline{X2} \cdot \alpha + \bar{\alpha} \cdot Y_0$$

In case of $\alpha = 1$, the total 8 bits of data including 4 bits in the X direction and 2 bits in the Y direction can be written at a time. In case of $\alpha = 0$, the total 8 bits of data including 8 bits in the X direction and 1 bit in the Y direction can be written at a time.

In case of the data written in the above described manner shown in FIG. 9B, if the data are read out by the above described memory cycle controller shown in FIG. 6, an inconvenience is caused in that the data are not read out in the writing order since 24 bits in the X direction and 1 bit in the Y direction are read out at a time. For this reason, a circuit as shown in FIG. 10 is needed.

In FIG. 10, the shift register 33 is composed of 24 bits so that 24 bits of data read out from the D-RAM's are loaded in response to the load pulse and successively shifted and provided as shifted data in response to the clock pulse. The output of the lowest bit of the shift register 33 is returned to the highest bit and is provided from the lowest bit and the fifth bit higher than the lowest bit by 4 bits. The output of the lowest bit is supplied to one input terminal of the AND gate 351 and the output of the fifth bit is supplied to one input terminal of the AND gate 353. To the other input terminal of the AND gate 351, an address signal $Y_0$ is supplied and to the other input terminal of the AND gate 353, an address signal $Y_0$ inverted by the inverter 352 is supplied. The respective outputs of the AND gates 351 and 353 are provided through the OR gate 354.

The address signal $Y_0$ is a minimum unit of the Y coordinates in the frame memory and changes as 0 or 1 alternately for each horizontal scanning line. More specifically, the address signal $Y_0$ is set to "0" to "1" in a horizontal blanking period. When the address signal $Y_0$ is "1", the AND gate 351 is opened to provide shifted data from the lowest bit of the shift register 33. When the address signal $Y_0$ is "0", the AND gate 353 is opened to provide shifted data from the fifth bit of the shift register 33.

The frame data read out by applying access to the frame memory 8 using the memory access circuit structured as described above are supplied to a look-up table memory, not shown. In the look-up table memory, multi-gradation color codes are stored for each of the colors red, green and blue so that color codes for each of red, green and blue are provided corresponding to the frame data read out from the frame memory 8. However, since the scanning speed is fast in a non-interlace CRT display unit of 60 Hz, the color codes provided from the look-up table memory are not stable and a good color pattern cannot be represented on the color monitor display 10.

Therefore, a color signal generating circuit capable of providing stable color codes is needed and a description thereof will be given in the following.

Figure 11A:
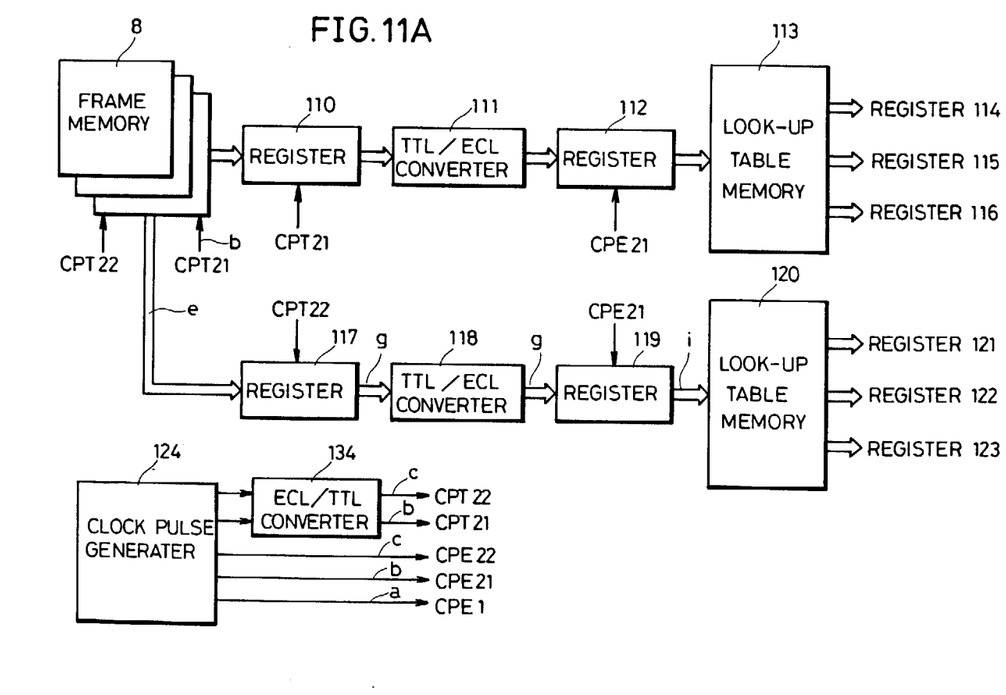
FIGS. 11A and 11B are block diagrams of a color signal generating circuit for reading data from the frame memory to generate a color signal.
Figure 11B:
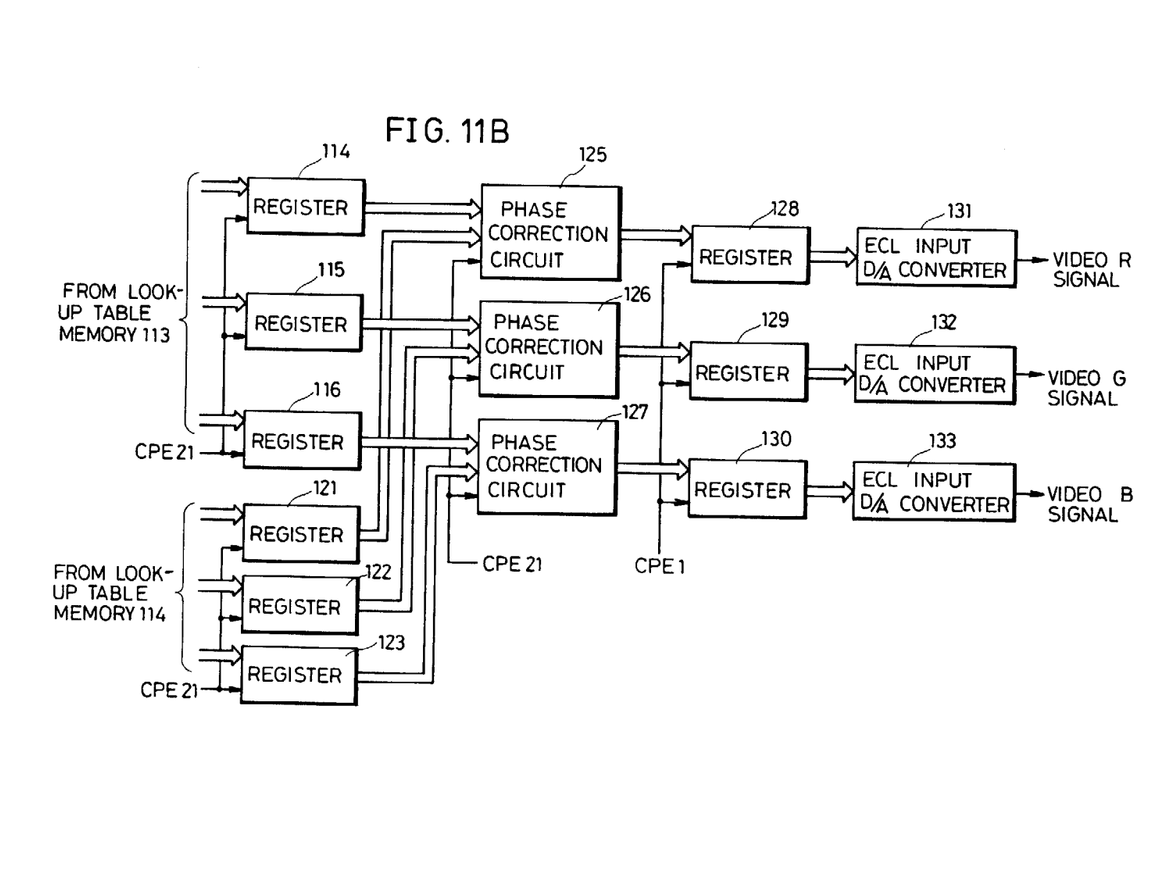
Figure 12:
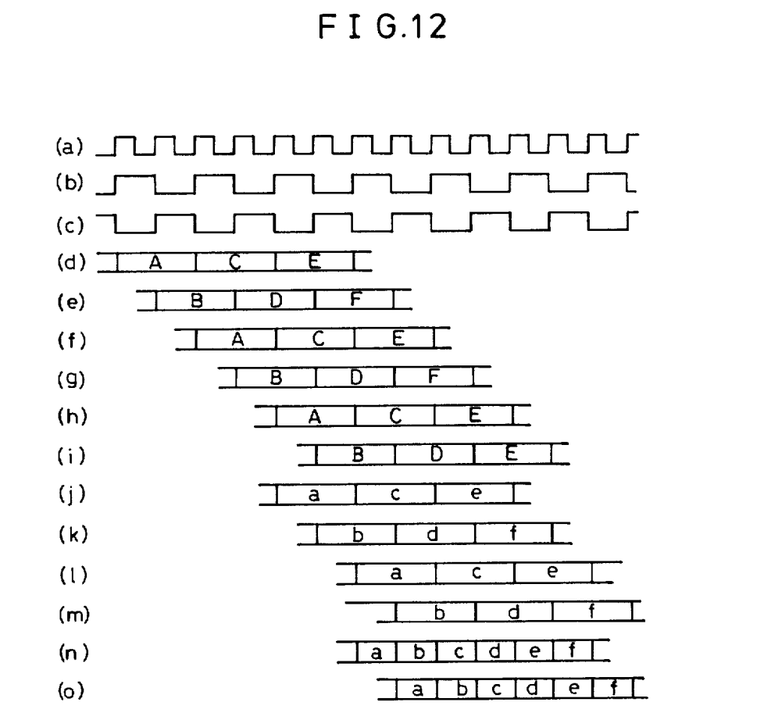
FIG. 12 is a timing chart of the respective portions shown in FIGS. 11A and 11B.

FIGS. 11A and 11B are schematic block diagrams of a color signal generating circuit and FIG. 12 is a timing chart of the respective portions shown in FIGS. 11A and 11B.

First, referring to FIG. 11A, a clock pulse generating circuit 124 serves to generate first, second and third clock pulses. More specifically, the first clock pulse CPE1 has a cycle corresponding to each pixel on the screen of the CRT display and is provided at ECL level as shown in FIG. 12(a). The second clock pulses CPE21 and CPT 21 have a cycle twice as large as that of the first clock pulse CPE1 as shown in FIG. 12(b). The clock pulse CPE21 is provided at the ECL level and the clock pulse CPT21 is provided after having been converted to the TTL level by an ECL/TTL converter 134. The third clock pulses CPE222 and CPT22 have the same cycle as that of the second clocks CPE21 and CPT21 as shown in FIG. 12(c), while the phase of the third clock pulses is delayed from that of the second clock pulses CPE21 and CPT21 by a cycle of one pixel. Accordingly, the clock pulse CPE22 is provided at the ECL level and the clock pulse CPT22 is provided after having been converted to the TTL level by the ECL/TTL converter 134.

The color data stored in the frame memory 8 are read out in response to the second and the third clock pulses CPT21 and CPT22. More specifically, the frame memory 8 reads out the color data A as shown in FIG. 12(d) upon receipt of the clock pulse CPT21. The color data A is supplied to a register 110. The register 110 comprises an IC of TTL and stores temporarily the color data A at the second leading edge of the clock pulse CPT21. With this timing, the color data C is read out from the frame memory 8. The color data A (FIG. 12(f)) stored in the register 110 is converted to the ECL level by the TTL/ECL converter 111 to be provided to the register 112. The TTL/ECL converter 111 serves to apply level conversion to the ECL level since the frame memory 8, the registers 110 and 117 are structured by IC's of TTL and the other components are structured by IC's of ECL.

As shown in FIG. 12(h), the register 112 stores the color data A at the third leading edge of the clock pulse CPE21. At this time, the color data C already read out from the frame memory 8 is stored in the register 110 at this leading edge (as shown in FIG. 12(f)). The color data A stored in the register 112 is supplied to the look-up table memory 113. The look-up table memory 113 reads out multi-gradation color codes a of red, green and blue corresponding to the color data A as shown in FIG. 12(j). The color codes a read out from the look-up table memory 113 are supplied to the registers 114 to 116 so as to be stored at the fourth leading edge of the clock pulse CPE21 (as shown in FIG. 12(l)). At this time, the color data C is stored in the register 112 at this fourth leading edge and multi-gradation color codes c of red, green and blue corresponding to the color data C are read out from the look-up table memory 113.

On the other hand, in synchronism with the leading edge of the clock pulse CPT22, the color data B as shown in FIG. 12(e) is read out from the frame memory 8. The color data B is supplied to the register 117. The register 117 stores temporarily the color data B at the second leading edge of the clock pulse CPT22. At this time, the subsequent color data D is read out from the frame memory 8 at this leading edge. The color data B stored in the register 117 is converted to the ECL level by the TTL/ECL converter 118 so as to be provided to the register 119. The register 119 stores the color data B at the third leading edge of the clock pulse CPE 22 (as shown in FIG. 12(i)).

At this time, the subsequent color data D is stored in the register 117 at the third leading edge. The color data B stored in the register 119 is supplied to the look-up table memory 120, from which multi-gradation color codes b of red, green and blue corresponding to the color data B are read out as shown in FIG. 12(k). The color codes b read out from the look-up table memory 120 are supplied to the registers 121 to 123 so as to be stored at the fourth leading edge of the clock pulse CPE22 as shown in FIG. 12(m). At this time, the color data D is stored in the register 119 at the fourth leading edge of the clock pulse CPE22 so that multi-gradation color codes d of red, green and blue corresponding to the color data D are read out from the look-up table memory 120.

The multi-gradation color codes a stored in the registers 114 to 116 and the multi-gradation color codes b stored in the registers 121 to 123 are supplied to the phase correction circuits 125 to 127. The phase correction circuit 125 applies phase correction by the phase of the clock pulse CPE21 shown in FIG. 12(b), with respect to the color codes a and b of different phases provided from the registers 114 to 116 and 121 to 123.

More specifically, the phase correction circuits 125 to 127 select the color codes a and b by a cycle corresponding to one pixel. Since the clock pulse CPE 21 has a cycle of 2 pixels, the width of the logic "1" or "0" is equal to a cycle of one pixel. Consequently, the color codes a are rendered effective when the clock pulse CPE 21 is the logic "1", and the color codes b are rendered effective when the clock pulse CPE21 is the logic "0". Then, as shown in FIG. 12(o), the color codes a and b are arranged by a cycle of one pixel. In the same manner, the color codes c and d are supplied to the phase correction circuits 125 to 127 at the subsequent leading edge of the clock pulse CPE21 and phase correction is applied in the same manner as described above. Accordingly, as shown in FIG. 12(o), the color codes c and d are successively arranged by a cycle of one pixel.

The color codes a, b, c and d provided from the phase correction circuits 125 to 127 are supplied to the registers 128 to 130 and stored therein successively at the leading edge of the clock pulse CPE1 as shown in FIG. 12(o) so as to be provided to the D/A converters 131 to 133. The D/A converters 131 to 133 comprise respectively high-speed D/A converters of ECL input for generating analog values corresponding to the color codes a to d. The outputs of the D/A converters 131 to 133 are supplied to the CRT display unit as video R, G, B signals.

In order to attain a higher degree of accuracy in the analog voltages of red, green and blue to be supplied to the CRT display unit, the ground of the analog signal and the ground of the digital signal are separated so that noise from the ground of the digital signal can be removed. The ground of the analog signal is connected in common with the ground of the CRT display unit so that voltage may change accurately according to a change of 1 LSB.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A high speed memory access circuit of a CRT display unit for representing a pattern by a plurality of dots on the screen of said CRT display unit, comprising:

a frame memory formed by dynamic random access memories including storage regions corresponding to the dots to be represented in the whole display area of said CRT screen, said storage regions being specified in advance by odd numbers and even numbers, so that data can be read out and written in a nibble mode;

clock pulse generating means, coupled to said frame memory, for generating clock pulses of different phases for reading out the data of the odd number regions and the data of the even number regions from said frame memory;

address control means, responsive to an external write signal, for generating address control signals for reading out first and second data, each comprising a plurality of bits and for generating first and second load pulses corresponding to the first and second data, said address control means including:

timing data storage means for storing in advance, write timing data and read timing data of said frame memory, so that the write timing data is provided upon receipt of the external write signal and the read timing data is provided in the absence of the external write signal;

counting means, coupled to said clock pulse generating means, for counting by a first predetermined number the clock pulses generated by said clock pulse generating means in a write mode selected upon receipt of the external write signal, and for counting by a second predetermined number the clock pulses generated in a read mode selected in the absence of the external write signal; and shift registers, coupled to said timing data storage means and said counting means, in which said write timing data or said read timing data provided from said timing data storage means are loaded each time said counting means counts the clock pulses by said first or second predetermined number, the address control signals and the first and second load pulses being generated by said shift registers in response to the loaded write timing data or read timing data and the clock pulses;

first parallel/series conversion means for receiving and supplying in series a plurality of bits of data corresponding to the odd number regions of the first data read out from said frame memory;

second parallel/series conversion means for receiving and supplying in series a plurality of bits of data corresponding to the even number regions of the first data read out from said frame memory;

third parallel/series conversion means for receiving and supplying in series a plurality of bits of data corresponding to the odd number regions of the second data read out from said frame memory;

fourth parallel/series conversion means for receiving and supplying in series a plurality of bits of data corresponding to the even number regions of the second data read out from said frame memory;

first control means for controlling said first and third parallel/series conversion means so that when the first load pulse is received, said third parallel-series conversion means is disabled only during the supply of data in series by said first parallel/series conversion means and after completion of the supply of data, said third parallel/series conversion means is enabled; and second control means for controlling said second and fourth parallel/series conversion means, so that when the second load pulse is received, said fourth parallel/series conversion means is disabled only during the supply of data in series by said second parallel/series conversion means and after completion of the supply of data, said fourth parallel/series conversion means is enabled.

2. A high speed memory access circuit of a CRT display unit in accordance with claim 1, wherein:

said shift registers comprise:
- first and second shift registers for generating said address control signals;
- a third shift register for generating a write enable signal for bringing said frame memory into a write state; and
- a fourth shift register for generating the first and second load pulses.

3. A high speed memory access circuit of a CRT display unit in accordance with claim 1, wherein:

said first control means comprises:
- a first counter circuit, coupled to said clock pulse generating means and said first parallel/serial conversion means, for counting the clock pulses from said clock pulse generating means when the first load pulse is received, so as to provide a third load pulse for loading in said first parallel/series conversion means, a plurality of bits of data corresponding to the odd number regions of the first data; and
- a second counter circuit, coupled to said clock pulse generating means and said third parallel/series conversion means, for counting the clock pulses from said clock pulse generating means when the first load pulse is received, so as to provide a fourth load pulse for loading in said third parallel/series conversion means, a plurality of bits of data corresponding to the odd number regions of the second data, as well as to provide a first hold signal for maintaining said third parallel/series conversion means in a hold state during the supply of data by said first parallel/series conversion means; and said second control means comprises:
- a third counter circuit, coupled to said clock pulse generating means and said second parallel/series conversion means, for counting the clock pulses from said clock pulse generating means when the second load pulse is received, so as to provide a fifth load pulse for loading in said second parallel/series conversion means, a plurality of bits of data corresponding to the even number regions of the first data; and
- a fourth counter circuit, coupled to said clock pulse generating means and said fourth parallel/series conversion means, for counting the clock pulses from said clock pulse generating means when the second load pulse is received, so as to provide a sixth load pulse for loading in said fourth parallel/series conversion means, a plurality of bits of data corresponding to the even number regions of the second data, as well as to provide a second hold signal for maintaining said fourth parallel/series conversion means in a hold state during the supply of data by said second parallel/series conversion means.

* * * * *

UNITED STATES PATENT AND TRADEMARK OFFICE
CERTIFICATE OF CORRECTION

PATENT NO. : 4,695,967
DATED : SEPTEMBER 22, 1987
INVENTOR(S) : MASAHIRO KODAMA ET AL.

It is certified that error appears in the above-identified patent and that said Letters Patent is hereby corrected as shown below:

Col. 2, line 10, "singals" should be --signals--.

Col. 5, line 7, "singal" should be --signal--.

Col. 6, line 43, "date" should be --data--.

Col. 7, line 16, "it" should be --in--;
line 58, "shfts" should be --shifts--.

Col. 9, line 10, "wtih" should be --with--;
line 54, "thelowest" should be --the lowest--.

Signed and Sealed this

Fifth Day of April, 1988

*Attest:*

DONALD J. QUIGG

*Attesting Officer*   *Commissioner of Patents and Trademarks*